US008868359B2

(12) United States Patent
Ganesh et al.

(10) Patent No.: US 8,868,359 B2
(45) Date of Patent: Oct. 21, 2014

(54) DEVICE AND METHOD FOR DETECTING AND LOCATING DEFECTS IN UNDERGROUND CABLES

(75) Inventors: Meena Ganesh, Clifton Park, NY (US); Ashok Sundaresan, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 345 days.

(21) Appl. No.: 13/098,218

(22) Filed: Apr. 29, 2011

(65) Prior Publication Data

US 2012/0278012 A1  Nov. 1, 2012

(51) Int. Cl.
*G01R 31/00* (2006.01)
*G01R 31/12* (2006.01)
*G01R 31/08* (2006.01)

(52) U.S. Cl.
CPC .......... *G01R 31/083* (2013.01); *G01R 31/1272* (2013.01)
USPC ......................................................... 702/58

(58) Field of Classification Search
USPC ......................................................... 702/58
See application file for complete search history.

(56) References Cited

U.S. PATENT DOCUMENTS

| 4,157,541 | A | * | 6/1979 | Harwell | 340/540 |
| 5,272,439 | A | * | 12/1993 | Mashikian et al. | 324/520 |
| 5,530,364 | A | * | 6/1996 | Mashikian et al. | 324/529 |
| RE35,561 | E | * | 7/1997 | Mashikian et al. | 324/520 |
| 5,726,574 | A | * | 3/1998 | Silverberg et al. | 324/529 |
| 6,225,811 | B1 | * | 5/2001 | Bruning et al. | 324/544 |
| 6,677,761 | B1 | * | 1/2004 | Greulich | 324/533 |
| 6,822,457 | B2 | | 11/2004 | Borchert et al. | |
| 6,853,196 | B1 | * | 2/2005 | Barnum et al. | 324/543 |
| 6,917,888 | B2 | | 7/2005 | Logvinov et al. | |
| 7,030,621 | B2 | | 4/2006 | Sarkozi et al. | |
| 7,069,116 | B2 | | 6/2006 | Kunsman et al. | |
| 7,202,672 | B2 | | 4/2007 | Hicks et al. | |
| 7,285,960 | B2 | | 10/2007 | Koch et al. | |
| 7,427,867 | B2 | * | 9/2008 | Haynes et al. | 324/603 |
| 7,532,012 | B2 | | 5/2009 | Cern | |
| 7,558,703 | B2 | | 7/2009 | Stoupis et al. | |
| 7,973,536 | B2 | | 7/2011 | Kojovic et al. | |
| 8,126,664 | B2 | * | 2/2012 | Fournier et al. | 702/59 |
| 2004/0230383 | A1 | * | 11/2004 | Bechhoefer et al. | 702/57 |
| 2004/0230385 | A1 | * | 11/2004 | Bechhoefer et al. | 702/57 |
| 2008/0048710 | A1 | * | 2/2008 | Cern | 324/772 |
| 2008/0231289 | A1 | | 9/2008 | Ganesh et al. | |
| 2009/0012727 | A1 | | 1/2009 | Siew et al. | |
| 2009/0088988 | A1 | * | 4/2009 | Muthu-Mannivannan et al. | 702/58 |

(Continued)

OTHER PUBLICATIONS

Phung et al., "Wavelet Transform Analysis of Partial Discharge Signals", Proceedings of AUPEC/EECON, pp. 277-283, Sep. 26-29, 1999, Darwin, Australia.

(Continued)

*Primary Examiner* — Jonathan C Teixeira Moffat
*Assistant Examiner* — Alvaro Fortich
(74) *Attorney, Agent, or Firm* — Nitin N. Joshi

(57) ABSTRACT

A device and method for detecting and locating defects in a cable are provided. The device and method may include using sensor feedback to determine that an insulation defect exists and to calculate the location of the insulation defect in a cable. The method may include performing principle component analysis to determine whether an insulation defect occurs and using extracted data to determine the location of the insulation defect.

20 Claims, 7 Drawing Sheets

(56) References Cited

U.S. PATENT DOCUMENTS

2009/0177420 A1    7/2009  Fournier et al.
2010/0007352 A1*   1/2010  Xie et al. ...................... 324/501
2010/0253364 A1   10/2010  Ganesh
2011/0043219 A1    2/2011  Ganesh et al.
2011/0074437 A1*   3/2011  Jung et al. ..................... 324/527
2013/0021039 A1*   1/2013  Bjorklund ...................... 324/535

OTHER PUBLICATIONS

Electrical Diagnostic Innovations, Inc.; "Radio Frequency Current Transformers", www.elec-di.com; pp. 1-2.

* cited by examiner

DEVICE AND METHOD FOR DETECTING AND LOCATING DEFECTS IN UNDERGROUND CABLES

BACKGROUND OF THE INVENTION

The subject matter disclosed herein relates generally to underground cables and, more particularly, to a device and method for detecting and locating defects in underground cables.

Underground cables enable electricity to travel from a power plant to residential and commercial customers. The cables include conductors where the electric current flows, and insulation that surrounds the conductors to inhibit the electric current from flowing outside the conductors. The cable insulation may deteriorate over time and become faulty, causing defects such as partial discharge. A partial discharge refers to an abrupt change in current in the cable that may be generated during the breakdown of insulation or when current arcs between the cable and another insulator. Protracted partial discharge may further erode the cable insulation and result in a total breakdown of insulation, or complete cable failure.

Monitoring the underground cables to detect defects such as partial discharge may be desirable in order to prevent a total breakdown of insulation or complete cable failure. When cables are monitored, a defect may be found before a complete breakdown occurs. The cable may be repaired or replaced to eliminate defects. Some monitoring systems may detect that a defect exists; however, such monitoring systems may fail to determine an accurate location on the cable where the defect can be found. With an accurate defect location, the task of repairing or replacing cables may be simplified. Therefore, a need exists for a device and/or method that can detect and accurately locate defects in underground cables.

BRIEF DESCRIPTION OF THE INVENTION

In accordance with one embodiment, a method for determining an insulation defect location in a cable is provided. The method includes receiving, at a data acquisition system, a first signal from a first sensor and calculating a first set of signal features using the first signal. The method also includes receiving a second set of signal features calculated using a second signal from a second sensor and calculating a set of derived features from the first and second sets of signal features. The method includes performing principal component analysis on the set of derived features to produce a first principal component and comparing the first principal component to a predetermined threshold to determine whether an insulation defect exists.

In accordance with another embodiment, one or more machine-readable storage media have application instructions encoded on them. The application instructions include instructions for receiving a first signal from a first sensor and instructions for calculating a first set of signal features using the first signal. The application instructions also include instructions for receiving a second set of signal features calculated using a second signal from a second sensor and instructions for calculating a set of derived features from the first and second sets of signal features. The application instructions include instructions for performing principal component analysis on the set of derived features to produce a first principal component and instructions for comparing the first principal component to a predetermined threshold to determine whether an insulation defect exists.

In accordance with a further embodiment, a device for detecting an insulation defect in a cable is provided. The device includes a housing, a memory device disposed in the housing and including executable application instructions stored therein, and a processor disposed in the housing and configured to execute the application instructions stored in the memory device. The application instructions include instructions for receiving a first signal from a first sensor, calculating a first set of signal features using the first signal, and receiving a second set of signal features calculated using a second signal from a second sensor. The application instructions also include instructions for calculating a set of derived features from the first and second sets of signal features, performing principal component analysis on the set of derived features to produce a first principal component, and comparing the first principal component to a predetermined threshold to determine whether an insulation defect exists.

BRIEF DESCRIPTION OF THE DRAWINGS

The various features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nervertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As discussed herein, a method or device for detecting and locating defects may be used with an underground cable system. The method or device may be part of a system that continuously or periodically monitors the underground cables in order to detect cable defects. Such a passive system enables the cables to be used for providing residential and/or commercial power while still monitoring for defects. When a defect is detected, the method or device discussed below is used to determine the location of the defect. The monitoring system may then report the defect and defect location to a monitoring station. With an early warning provided, the cable may be repaired or replaced to inhibit further cable defects from occurring. Such a method or device may decrease the cost of maintaining an underground cable system by detecting and accurately locating cable defects.

Figure 1:
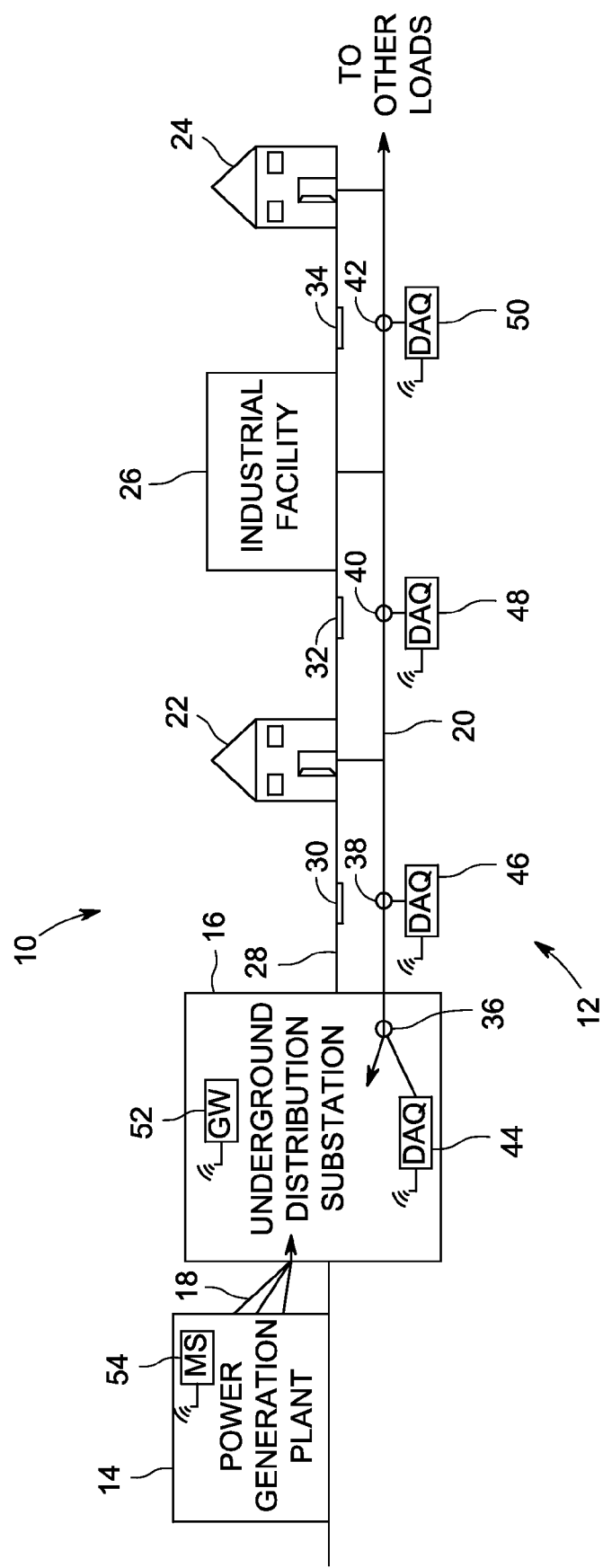
FIG. 1 is a diagrammatical view of an embodiment of a power grid system including a monitoring system for detecting insulation defects in an underground cable.

With the foregoing comments in mind and turning to FIG. 1, this figure illustrates diagrammatically a power grid system 10 including a monitoring system 12 for detecting insulation defects in an underground cable. In the illustrated embodiment, the power grid system 10 includes a power generation plant 14, an underground distribution substation 16, and cable systems 18 and 20. The power generation plant 14 provides electrical power to loads connected to the power grid system 10, such as residences 22 and 24, and an industrial facility 26. The power generation plant 14 may include one or more generators for converting mechanical energy into electrical power. Electrical power is carried from the power generation plant 14 to the underground distribution substation 16 using cable system 18. The underground distribution substation 16 may transform voltage from high to low with a step-down transformer, or transform voltage from low to high with a step-up transformer. Furthermore, the underground distribution substation 16 may include switches, protection equipment, and control equipment, in addition to one or more transformers.

As illustrated, electrical power is carried from the underground distribution substation 16 to the residences 22 and 24, and the industrial facility 26 using the underground cable system 20. The underground cable system 20 carries the electrical power below ground level 28. Manholes 30, 32, and 34 are positioned at various locations to provide access to the underground cable system 20, such as for maintenance, installation, and cable monitoring. For example, the monitoring system 12 may be installed and maintained using the manholes 30, 32, and 34 to access portions of the monitoring system 12.

The monitoring system 12 includes sensors 36, 38, 40, and 42, data acquisition systems 44, 46, 48, and 50, a gateway device 52, and a monitoring station 54. The number of sensors 36, 38, 40, and 42 and data acquisition systems 44, 46, 48, and 50 in certain embodiments may be less than or greater than the depicted four. For example, the monitoring system 12 may include 2, 3, 4, 5, 6, 10, 20, 50, 100, or any other number of sensors 36, 38, 40, and 42 and corresponding data acquisition systems 44, 46, 48, and 50. Likewise, the monitoring system 12 may include more than one gateway device 52 and monitoring station 54.

The sensors 36, 38, 40, and 42 are coupled to the underground cable system 20 at various locations to enable monitoring of the underground cable system 20. Furthermore, the sensors 36, 38, 40, and 42 may be placed on, around, or adjacent to cable segments of the underground cable system 20 in order to monitor the electrical power running through the cables. For example, the sensors 36, 38, 40, and 42 may be clamped to the underground cable system 20. The sensors 36, 38, 40, and 42 may be any type of sensor commercially or otherwise available that can passively monitor the electrical power running through the cables. For example, the sensors 36, 38, 40, and 42 may each be a radio frequency current transformer (RFCT), or a high frequency current transformer (HFCT). In one embodiment, the sensors 36, 38, 40, and 42 may be an RFCT such as an RFCT manufactured by Fischer Custom Communications, Inc. Passive monitoring enables the electric power running through the underground cable system 20 to be monitored external to the cables without interfering with the electric power running through the cables. As such, passive monitoring enables the monitoring system 12 to monitor to signals that emanate from the underground cable system 20.

Each sensor 36, 38, 40, and 42 is coupled to a respective data acquisition system 44, 46, 48, and 50, in a wired or wireless manner. The data acquisition systems 44, 46, 48, and 50 receive signals transmitted from the sensors 36, 38, 40, and 42. The sensor signals are analyzed by the data acquisition systems 44, 46, 48, and 50 to determine if a defect is present, or absent, in the portion of the cable monitored by the sensors 36, 38, 40, and 42.

Data acquisition systems 44, 46, 48, and 50 communicate together to transfer signal features extracted from the signals. Furthermore, data acquisition systems 44, 46, 48, and 50 may transmit extracted signal features to another device in the monitoring system 12 to determine whether a defect occurred and to calculate a location of the defect. Specifically, the data acquisition systems 44, 46, 48, and 50 may be organized into pairs including a master data acquisition system and a slave data acquisition system. Together, the master and slave data acquisition systems may determine that a defect occurred and calculate the location of the defect.

When organized into pairs, each data acquisition system 44, 46, 48, and 50 may be part of two different pairs. For example, one pair may include data acquisition system 44 configured as a master and data acquisition system 46 configured as a slave. A second pair may include data acquisition system 48 configured as a master and data acquisition system 46 configured as a slave. Furthermore, a third pair may include data acquisition system 48 configured as a master and data acquisition system 50 configured as a slave. Thus, with such a configuration, the underground cable system 20 may be monitored by the first, second, and third data pair to enable monitoring coverage between data acquisition system 44 and data acquisition system 50. Furthermore, each data acquisition system 44, 46, 48, and 50 may regularly synchronize an internal clock with a standardized time, such as a NIST clock, or using GPS. In addition, each pair of data acquisition systems may regularly synchronize an internal clock with each other, such as once per day, or once per hour, for example.

In one embodiment, the data acquisition systems 44, 46, 48, and 50 communicate wirelessly with the gateway device 52. The gateway device 52 receives data from the data acquisition systems 44, 46, 48, and 50 indicating that a defect occurred and indicating the location of the defect. The gateway device 52 may be any device that may receive data from the data acquisition systems 44, 46, 48, and 50 and transmit the data to the monitoring station 54. For example, the gateway device 52 may be a Wireless Gateway, a WireLess product made by WiYZ. In certain embodiments, the gateway device 52 may be a desktop computer, laptop computer, a wireless collector/repeater, or another wireless device.

The gateway device 52 transmits the defect data to the monitoring station 54. In certain embodiments, the gateway device 52 may communicate via supervisory control and data acquisition (SCADA) or server side includes (SSI). The monitoring station 54 may be any device that may receive data from the gateway device 52 and display the data. For example, the monitoring station 54 may be a desktop or laptop computer. In certain embodiments, the gateway device 52, or the monitoring station 54 may receive data directly from the data acquisition systems 44, 46, 48, and 50 to determine whether a defect occurred and to calculate the location of the defect. Still, in further embodiments, the gateway device 52 may receive data directly from the data acquisition systems 44, 46, 48, and 50, then transmit the data to the monitoring station 54 to determine whether a defect occurred and then to calculate the location of the defect.

Figure 2:
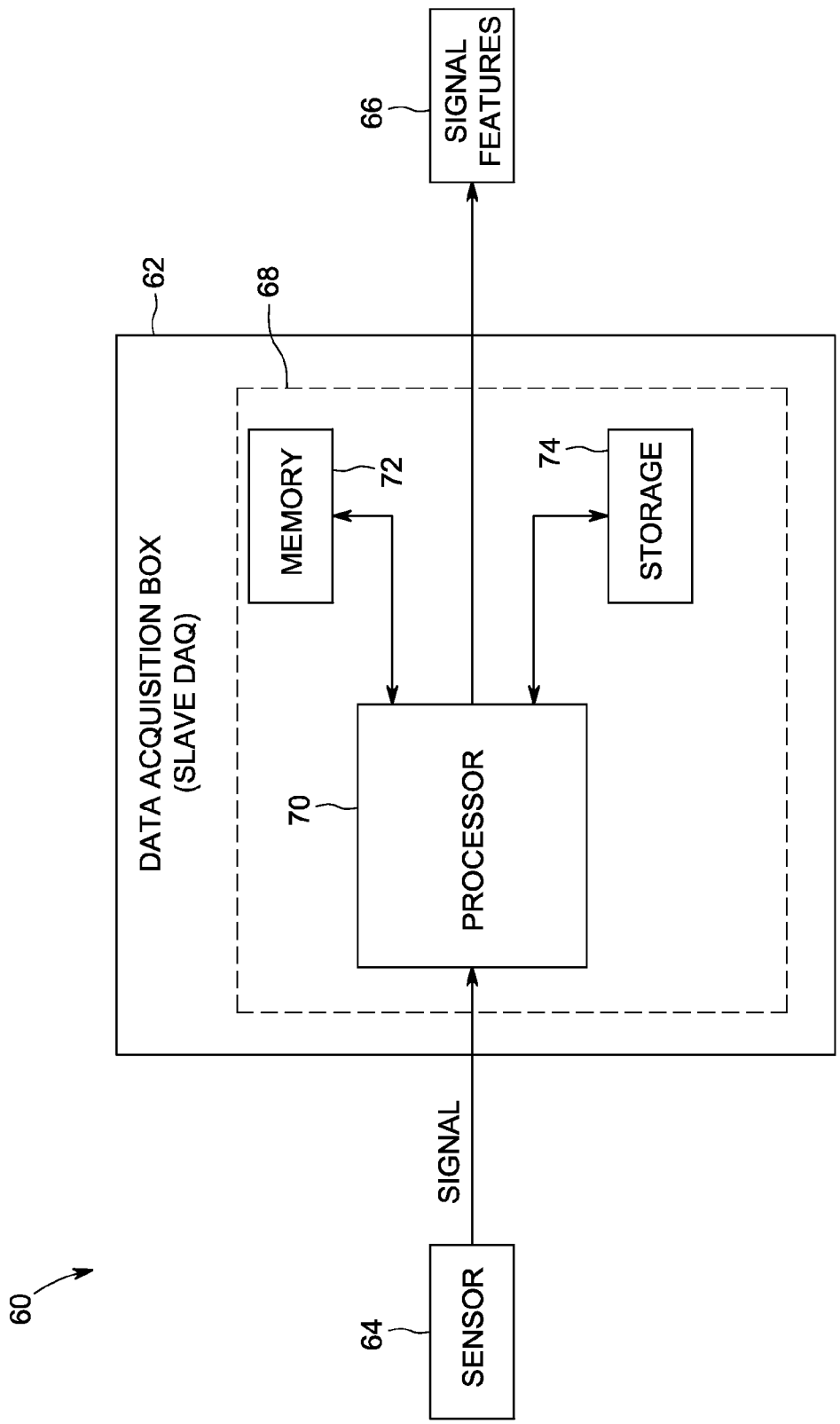
FIG. 2 is a diagrammatical view of an embodiment of a slave data acquisition system that may be included in the monitoring system of FIG. 1 and may be used to determine signal features.

With the foregoing in mind, FIG. 2 is a diagrammatical view 60 of an embodiment of a slave data acquisition system (slave DAQ) 62 that may be included in the monitoring system 12 of FIG. 1 and may be used to determine signal features. In the illustrated embodiment, the slave DAQ 62 receives a signal from a sensor 64, such as an RFCT. The slave DAQ 62 processes the signal and transmits signal features 66 to a master data acquisition system, such as the master data acquisition system described in FIG. 3. In certain embodiments, the slave DAQ 62 transmits signal features 66 to a gateway device, or a monitoring station.

The slave DAQ 62 may include a housing 68 to enclose at least one processor 70, memory device 72, and storage device 74. The processor 70 may execute the instructions to analyze and process the signal from the sensor 64 and instructions to extract the signal features 66. Furthermore, the processor 70 may include one or more microprocessors, such as one or more "general-purpose" microprocessors, one or more special-purpose microprocessors and/or ASICS, or some combination thereof. For example, the processor 70 may include one or more reduced instruction set (RISC) processors.

The memory device 72 may include a volatile memory, such as random access memory (RAM), and/or a nonvolatile memory, such as read-only memory (ROM). The memory device 72 may store a variety of information and may be used for various purposes. For example, the memory device 72 may store processor-executable instructions (e.g., firmware or software) for the processor 70 to execute, such as instructions for calculating an insulation defect location or instructions for determining signal features. The storage device 74 (e.g., nonvolatile storage) of the slave DAQ 62 of the presently illustrated embodiment may include ROM, flash memory, a hard drive, or any other suitable optical, magnetic, or solid-state storage medium, or a combination thereof. The storage device 74 may store data (e.g., sensor data), instructions (e.g., software or firmware to implement functions of the slave DAQ 62), and any other suitable data.

Figure 3:
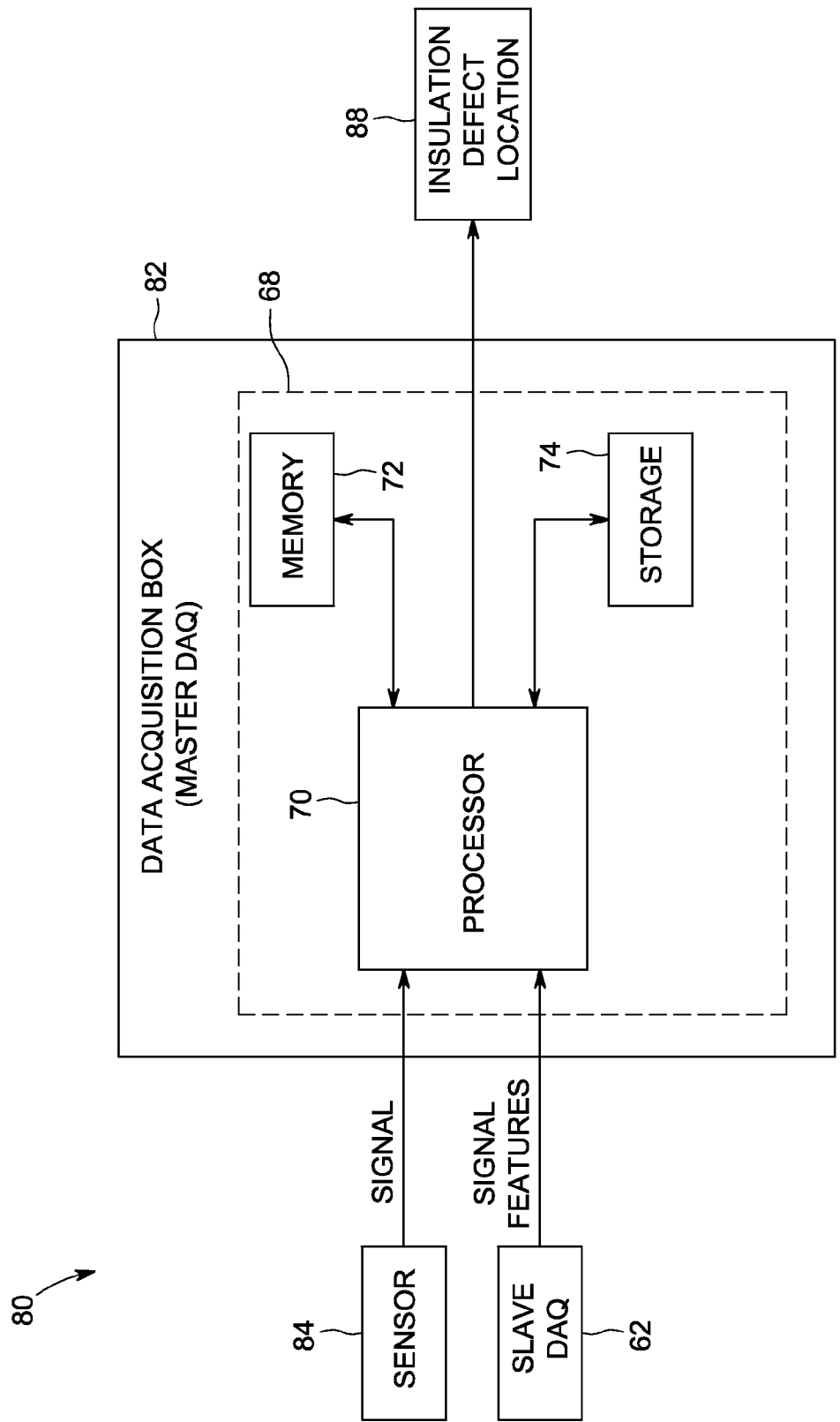
FIG. 3 is a diagrammatical view of an embodiment of a master data acquisition system that may be included in the monitoring system of FIG. 1 and may be used to calculate the location of a partial discharge.

Turning to FIG. 3, illustrated is a diagrammatical view 80 of an embodiment of a master data acquisition system (master DAQ) 82 that may be included in the monitoring system 12 of FIG. 1. The master DAQ may be used to compute features from the signal received from a sensor 84. Furthermore, the master DAQ 82 may be used to determine the presence and/or absence of an insulation defect. In addition, the master DAQ 82 may use the determination of a defect to calculate the location of the insulation defect. In the illustrated embodiment, the master DAQ 82 receives a signal from the sensor 84, such as an RFCT, and signal features from the slave DAQ 62. The master DAQ 82 processes the signal from the sensor 84 and the signal features from the slave DAQ 62 to detect an insulation defect and to determine an insulation defect location 88. The master DAQ 82 transmits the insulation defect location 88 to another device, such as the gateway device 52 described in FIG. 1. In certain embodiments, the master DAQ 82 transmits the insulation defect location 88 to a monitoring station, such as the monitoring station 54 of FIG. 1. Like the slave DAQ 62 described in FIG. 2, the master DAQ 82 may include a housing 68 to enclose at least one processor 70, memory device 72, and storage device 74.

Figure 4:
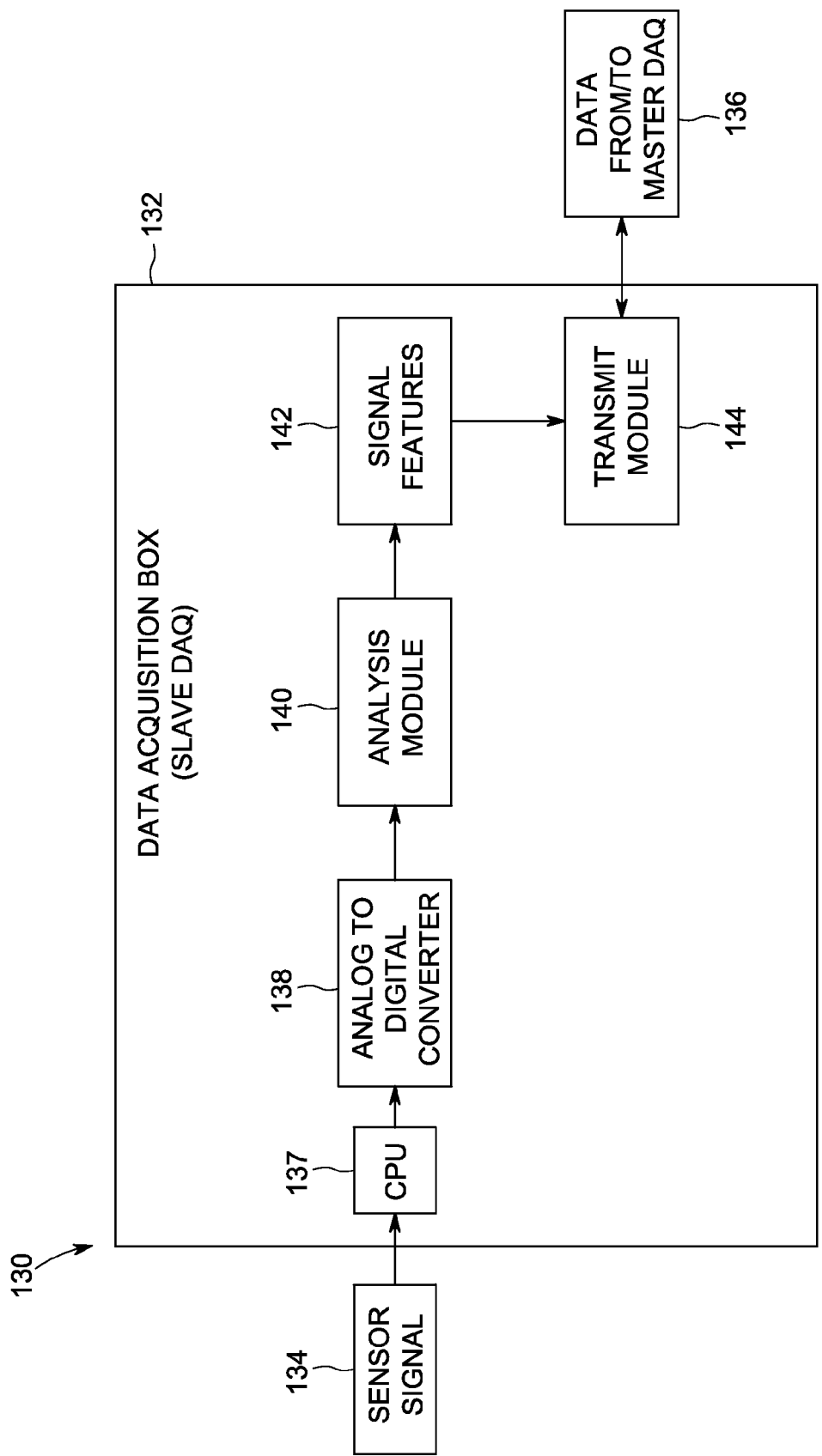
FIG. 4 is a block diagram of an embodiment of a slave data acquisition system that may be included in the monitoring system of FIG. 1 and may be used to calculate cumulative wavelet energy.

Moving on to FIG. 4, illustrated is a block diagram 130 of a slave DAQ 132 that may be included in the monitoring system 12 of FIG. 1 and may be used to extract signal features. In certain embodiments where the data acquisition systems do not have a master/slave relationship, the slave DAQ 132 illustrated may be the data acquisition system used. For example, the slave DAQ 132 may be one embodiment of a data acquisition system in systems where all data acquisition systems communicate directly with a gateway device. In the illustrated embodiment, the slave DAQ 132 receives an analog signal 134 from a sensor, such as an RFCT. The slave DAQ 132 processes the analog signal 134 and transmits data 136 to and/or from a master data acquisition system, such as the master data acquisition system described in FIG. 5. In certain embodiments, the slave DAQ 132 transmits data 136 to a gateway device, or a monitoring station. Although an analog signal 134 is discussed, other embodiments of the slave DAQ 132 may receive a digital signal, such as from a digital sensor.

As illustrated, the slave DAQ 132 includes a central processing unit (CPU) 137 which receives the sensor signal 134 and provides the signal to an analog-to-digital converter 138. The analog-to-digital converter 138 converts the analog signal 134 to a digital signal which includes digital data. An analysis module 140 analyzes the digital data to extract signal features 142 which are used to detect a defect in the data, such as an insulation defect. Furthermore, the analysis module 140 may use algorithms and decision models in order to extract the signal features 142. For example, the analysis module 140 may calculate cumulative wavelet energy. One embodiment of the analysis module 140 is described below in relation to FIG. 6.

The analysis module 140 uses the algorithms and models to reduce the size of the digital data to include the most relevant signal features 142. For example, the digital data may include approximately 2500 bytes of data, while the extracted signal features 142 include approximately 100 bytes of data. The signal features 142 include data that may be used to detect a defect in conjunction with another set of signal features and to calculate the location of the defect. A transmit module 144 sends the signal features 142 as part of the data 136. The transmit module 144 includes a wireless network card for transmitting the data 136 wirelessly. Such a wireless network card may be a Peripheral Component Interconnect (PCI) card that may communicate up to 900 meters, for example.

With the digital data reduced to signal features 142, such as with a 96 percent reduction in size, the data 136 transmitted to the master data acquisition system is greatly reduced. Therefore, the wireless communication traffic may be limited. As may be appreciated, the slave DAQ 132 may receive data 136 from the master data acquisition system or other monitoring system device. For example, the slave DAQ 132 may receive an acknowledgment signal or a status check signal. Likewise, the slave DAQ 132 may send data 136 other than signal features 142 to the master data acquisition system or other monitoring system device. For example, the slave DAQ 132 may send data reporting on the status of the slave DAQ 132, among other things. As may be appreciated, the analog-to-digital converter 138, analysis module 140, and transmit module 144 may each include memory, storage, or a buffer area to temporarily store data while the data is being processed or analyzed. Furthermore, the memory, storage, or buffer area may be cleared as needed for additional data, such as when a decision based on the data has been made.

Figure 5:
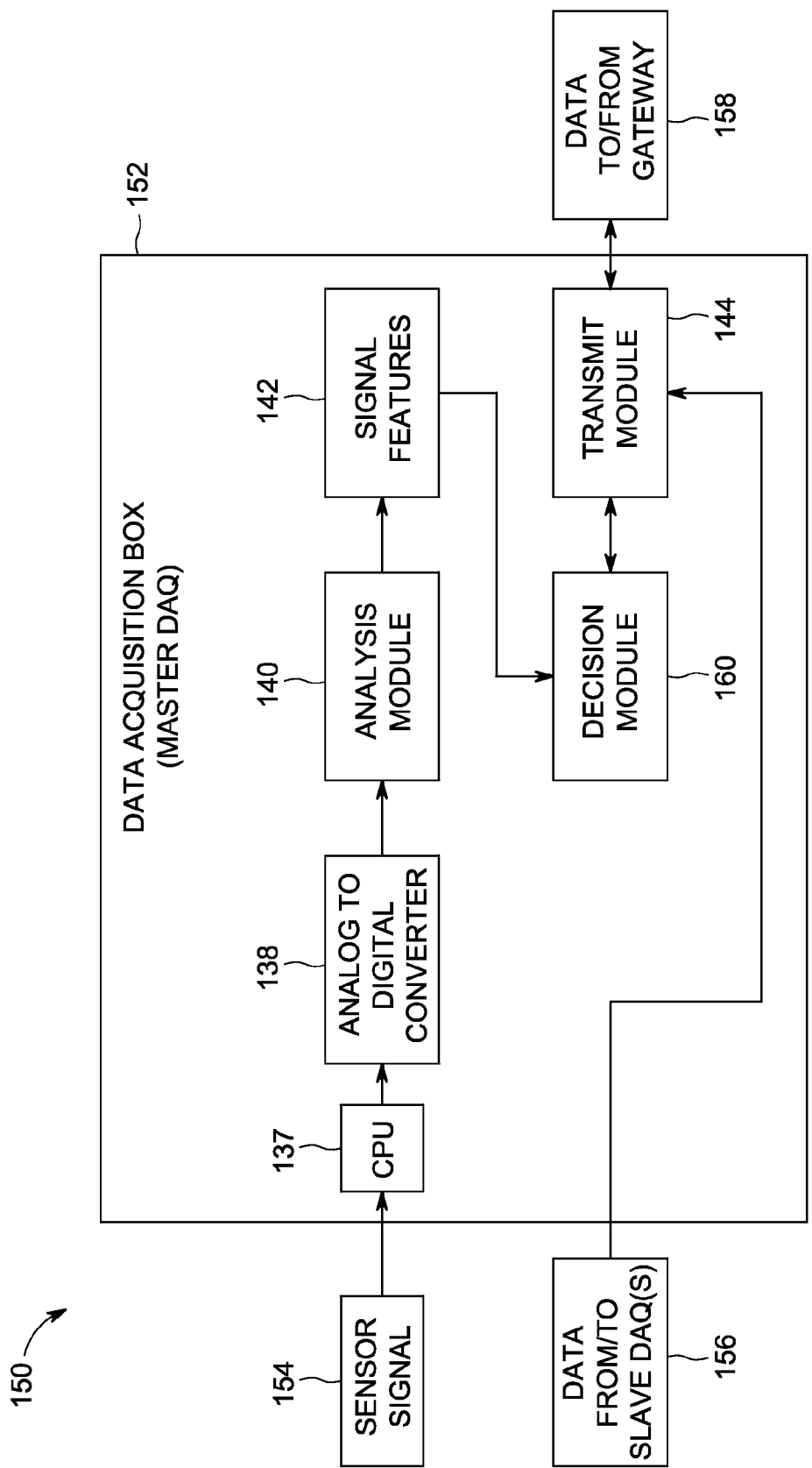
FIG. 5 is a block diagram of an embodiment of a master data acquisition system that may be included in the monitoring system of FIG. 1 and may be used to calculate the location of an insulation defect.

Turning to FIG. 5, illustrated is a block diagram 150 of a master DAQ 152 that may be included in the monitoring system 12 of FIG. 1 and may be used to determine whether an insulation defect exists, and to calculate the location of the insulation defect. In the illustrated embodiment, the master DAQ 152 receives an analog signal 154 from a sensor, such as an RFCT. The master DAQ 152 also transmits data 156 to and/or from a slave DAQ, such as the slave DAQ 132 of FIG. 4. The master DAQ 152 processes the analog signal 154 and transmits data 158 to and/or from a gateway device, such as the gateway device 52 of FIG. 1. Although an analog signal 154 is described, other embodiments of the master DAQ 152 may receive a digital signal, such as from a digital sensor.

As illustrated, the master DAQ 152 includes a central processing unit (CPU) 137 which receives the sensor signal 134 and provides the signal to an analog-to-digital converter 138. The analog-to-digital converter 138 converts the analog signal 154 to a digital signal which includes digital data. An analysis module 140 analyzes the digital data to extract signal features 142 which are used to detect a defect in the data, such as an insulation defect. Furthermore, the analysis module 140 may use algorithms and decision models in order to extract the signal features 142. For example, the analysis module 140 may calculate cumulative wavelet energy. One embodiment of the analysis module 140 is described below in relation to FIG. 6. The analysis module 140 uses the algorithms and models to reduce the size of the digital data to include the most relative signal features 142. For example, the digital data may include approximately 2500 bytes of data, while the extracted signal features 142 include approximately 100 bytes of data. The signal features 142 include data that may be used to correlate with another set of signal features and to calculate the location of the defect.

A decision module 160 receives the signal features 142 and data 156 from a slave DAQ, which includes signal features from the slave DAQ. The decision module 160 determines whether a defect exists and calculates a location of the defect. A transmit module 144 sends the defect information as part of the data 158. As may be appreciated, the master DAQ 152 may receive data 158 from the gateway device or another device in the monitoring system. For example, the master DAQ 152 may receive an acknowledgment signal or a status check signal Likewise, the master DAQ 152 may send data 158, other than defect data, to the gateway device. For example, the master DAQ 152 may send data reporting on the status of the master DAQ 152, among other things. As may be appreciated, the decision module 160 may include memory, storage, or a buffer area to temporarily store data while the data is being processed or analyzed. Furthermore, the memory, storage, or buffer area may be cleared as needed for additional data, such as when a decision based on the data has been made.

Figure 6:
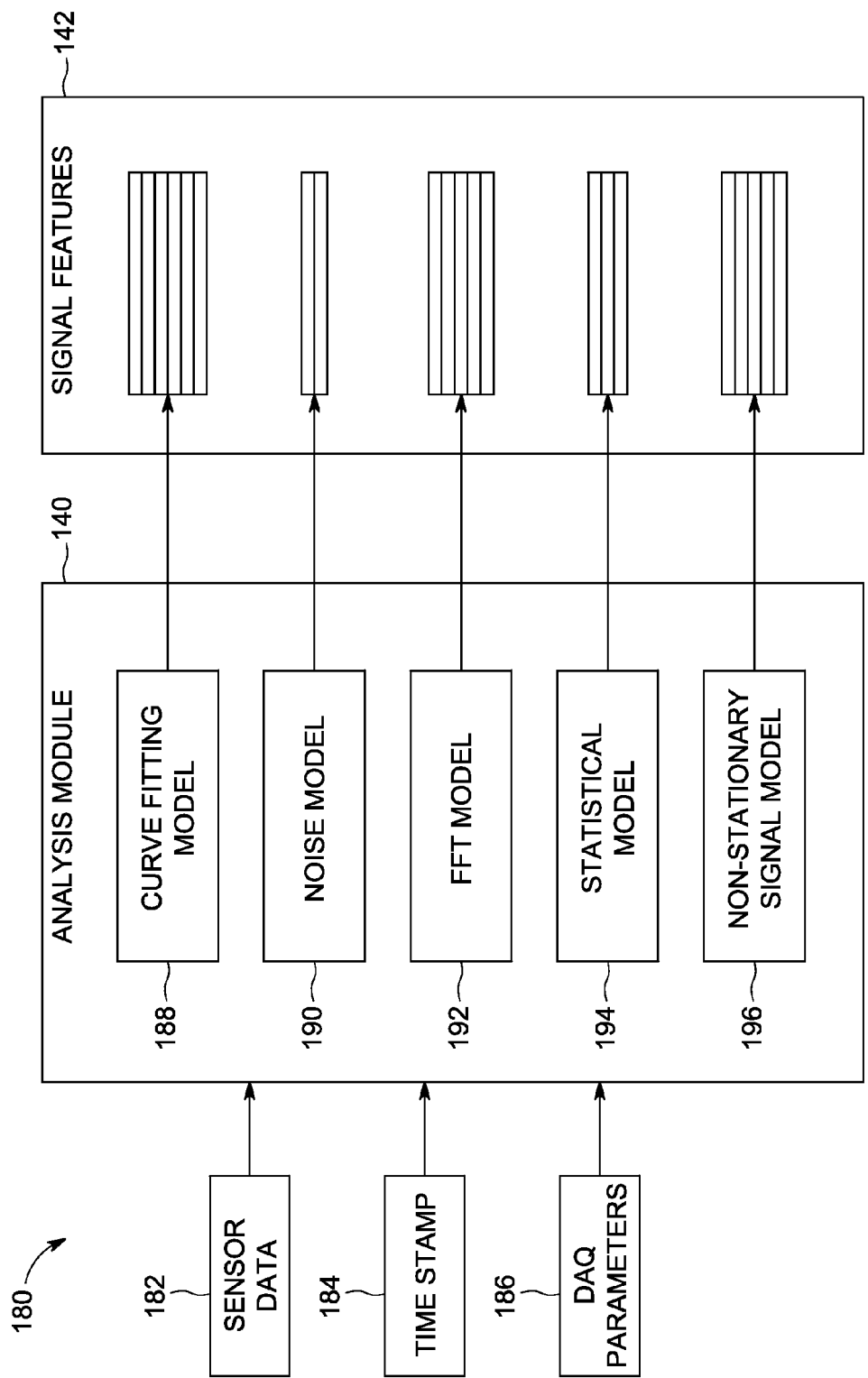
FIG. 6 is a flow diagram of an embodiment of an analysis module that may be included in the data acquisition system of FIG. 4 or FIG. 5 and may be used to calculate cumulative wavelet energy.

Turning to FIG. 6, illustrated is a flow diagram 180 of an embodiment of an analysis module 140 that may be included in the data acquisition system 132 or 152 of FIG. 4 or FIG. 5. The analysis module 140 receives sensor data 182, analyzes the data 182 and extracts signal features 142. The sensor data 182 may be data transmitted directly from a sensor, such as an RFCT, or the sensor data 182 may be data transmitted from an analog-to-digital converter, such as the analog-to-digital converter 138 illustrated in FIGS. 4 and 5. Furthermore, the sensor data 182 is received and/or organized into groups of data, such as 5000 byte groups for example.

The analysis module 140 also receives a time stamp 184 and data acquisition system parameters (DAQ parameters) 186. The time stamp 184 corresponds to the time when sensor data 182 was captured. The time stamp 184 may be used by the analysis module 140 when extracting data and is included in the extracted signal features 142. The DAQ parameters 186 include operating conditions used by the DAQ to capture and analyze sensor data 182.

The analysis module 140 uses various models to generate the desired signal features 142. For example, these models may include a curve fitting model 188, a noise model 190, a fast-Fourier transform (FFT) model 192, a statistical model 194, and a non-stationary signal model 196. Each of these models includes a set of executable code (i.e., instructions) that is used to analyze the sensor data 182 and produce one or more signal features 142.

Specifically, the curve fitting model 188 may be used to perform Weibull analysis on the sensor data 182, while the noise model 190 may be used to generate data from the sensor data 182 that can be used to differentiate between noise and a signal that assists in determining whether there is a defect in the insulation. Furthermore, the FFT model 192 may be used to perform a discrete Fourier transform on the sensor data 182 to determine the component frequencies of the signal. The statistical model 194 is a group of statistical routines that may be used to extract common descriptive statistics associated with the sensor data 182 and the non-stationary signal model 196 may use empirical mode decomposition (EMD) to extract energies of four intrinsic mode functions and/or may compute cumulative energy using continuous wavelet transform (CWT).

Any number of signal features may be extracted from the sensor data 182, such as signal features from a statistical group (e.g., minimum, maximum, mean, harmonic or geometric mean, RMS, crest factor, absolute deviation, standard deviation, skew, kurtosis), shape related group (e.g., area, amplitude or shape when curve fitted as Weibull, regression, slope, inflection point, maximum point), and/or signal processing group (e.g., amplitude, frequency, or phase with DC removed, ten highest frequencies, index, maximum cumulative energy, frame mean, frame median). To obtain the signal features 142, models 188, 190, 192, 194, and/or 196 may be used, as well as any other model. For example, CWT may be used to convert a group of sensor data 182 from a time representation to a time-scale representation. The CWT coefficients may be obtained by using "db2" or "bior" wavelets.

Furthermore, cumulative energy may be calculated by summing the square of the CWT coefficients. Certain signal features 142 may be extracted and/or calculated from the group of signal data 182 based on the calculated cumulative energy. Specifically, an index, a maximum cumulative energy, a frame mean, and a frame median may be calculated and/or extracted. The index is the sample number when the maximum cumulative energy occurs in the group of sensor data 182. When the index is correlated with a time stamp, the time when the maximum cumulative energy occurred may be determined. The maximum cumulative energy is the maximum cumulative energy that correlates to the index. A group of sensor data 182 may be subdivided into frames. For example, a group of sensor data 182 may be divided into 100 frames. Therefore, if a group of sensor data 182 includes 5000 bytes or samples, such a frame would include 50 bytes or samples. Thus, the frame mean is the mean from the frame that contains the maximum cumulative energy. Furthermore, the frame median is the median from the frame with the maximum cumulative energy. The extracted data is combined to create the signal features 142 data packet. The signal features 142 are a set of parameters that collectively describe the signal without the need for reproducing the entirety of the signal. The signal features 142 are output for further processing or transmission to another device.

Figure 7:
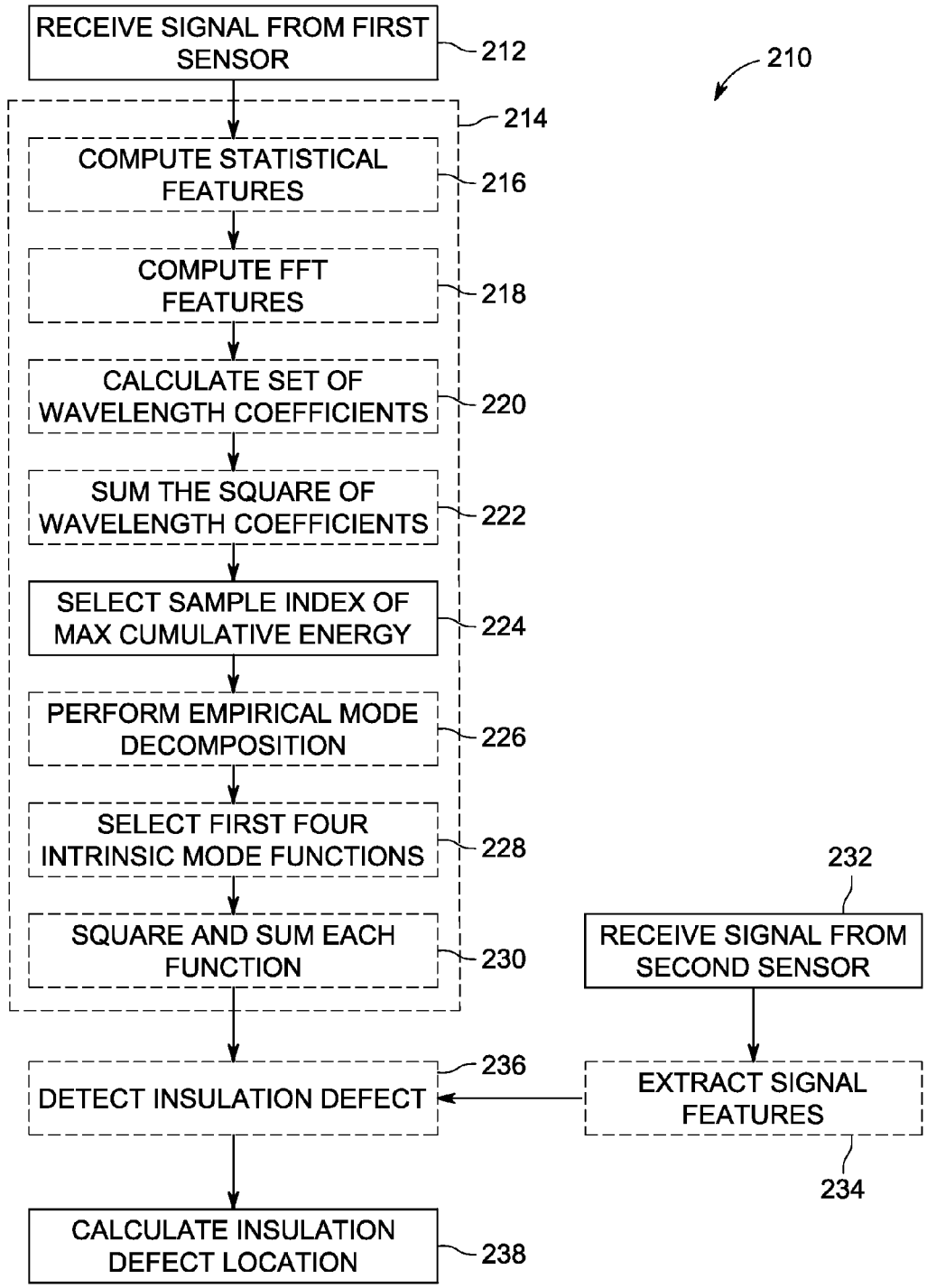
FIG. 7 is a flow chart of an embodiment of a method for determining the location of an insulation defect in an underground cable.

Turning to FIG. 7, illustrated is a flow chart 210 of an embodiment of a method for detecting an insulation defect and determining the location of the insulation defect, such as in an underground cable. At step 212, a first processing device, such as the data acquisition system 44, gateway device 52, or monitoring station 54 of FIG. 1, receives a first signal from a first sensor. The first sensor may be any sensor that can be used to detect defects in underground cable systems or other cable systems, such as the sensor 36 of FIG. 1. Next, at step 214, the first processing device extracts a first set of signal features. The first set of signal features may be extracted using any number of algorithms or models that the first processing device is configured to use. For example, the first set of signal features may be extracted using curve fitting, noise, FFT, statistical, and/or non-stationary signal models. In certain embodiments, the following features are extracted and included in the first set of signal features: statistical features including mean, variance, skewness, and kurtosis; FFT based features including the highest four frequencies in the Fourier spectrum; and non-stationary signal analysis based features including energies of the first four intrinsic mode functions obtained using EMD and cumulative energy computed using CWT.

As illustrated, steps 216 through 230 are encompassed by step 214 and they involve steps for calculating and extracting a first set of signal features using the first signal. In step 216, statistical features like mean, variance, skewness and kurtosis may be computed using the first sensor signal. In step 218, the first processing device computes the Fourier spectrum of the first sensor signal and extracts the first four highest frequencies present in the Fourier spectrum. To calculate cumulative wavelet energy, steps 220 and 222 may be performed. At step 220, the first processing device calculates a set of wavelength coefficients using the sensor signal. Such a calculation may be made using "db2", "bior", or any other type of wavelets, for example. Then, at step 222, the set of wavelength coefficients may be squared and added together to obtain the cumulative wavelet energy.

Next, at step 224, the first processing device analyzes the cumulative wavelet energy and a sample index of the maximum cumulative wavelet energy is selected. For example, a group of data may be 5000 bytes and the sample index is the byte number that includes the maximum cumulative energy, such as any number between 1 and 5000. As previously discussed, the sample number is correlated with a time stamp and the time when the maximum cumulative energy occurred may be determined. Steps 226 through 230 depict the computation and selection of the energies of the first four intrinsic mode functions. Specifically, in step 226, the first processing device performs the empirical mode decomposition of the first signal received from the first sensor which results in several intrinsic mode functions characterizing the first sensor signal. In step 228, the first four intrinsic mode functions are selected. Next, at step 230, each of the four intrinsic mode functions are squared and summed to give the energy corresponding to each intrinsic mode function.

At step 232, a second processing device receives a second signal from a second sensor. The second processing device may extract a second set of signal features, per step 234, and transmit the second set of signal features to the first processing device. In certain embodiments, the following thirteen features are extracted and included in the second set of signal features: statistical features including mean, variance, skewness, and kurtosis; FFT based features including the highest four frequencies in the Fourier spectrum; and non-stationary signal analysis based features including energies of the first four intrinsic mode functions obtained using EMD and cumulative energy computed using CWT. Step 234 may include similar steps to step 214 (i.e., steps 216 through 230). Furthermore, in certain embodiments, the first and second processing devices may be the same device.

At step 236, the first processing device may decide whether an insulation defect is detected using the first and second sets of extracted signal features. An insulation defect may be detected using one of a variety of methods for analyzing the first and second sets of extracted signal features, such as by clustering via principal component analysis (PCA). In certain embodiments, the specific thirteen features previously described are included in the first and second sets of extracted signal features and combined to create a set of twenty-six features. From the twenty-six features, thirteen features are derived. The derived features are calculated by dividing each feature from the first sensor by a corresponding feature from the second sensor (i.e., Derived feature=Feature from first sensor/Corresponding feature from second sensor). The thirteen derived features are put into a feature vector $F_t$. The feature vector $F_t$ is multiplied by a first principle component (PC) $v_1$ to transform the feature vector to the PC space ($F_t'=F_t*v_1$). The resulting value $F_t'$ is compared to a threshold τ. If $F_t'$ is greater than threshold τ, than there is no insulation defect detected between the first and second sensor. Conversely, if $F_t'$ is less than threshold τ, than there is an insulation defect detected between the first and second sensor. If an insulation defect is detected, the method proceeds to step 238. In such embodiments, threshold τ may be approximately 26.0 to 27.5. Specifically, threshold τ may be approximately 26.9111.

The threshold τ may be determined using PCA on sample data that includes extracted signal features taken evenly from data where insulation defects exist and from data where insulation defects do not exist. Specifically, a covariance matrix using the sample data containing the features is created. Eigenvector and eigenvalues that correspond to the covariance matrix are calculated. The first PC $v_1$ is the eigenvector corresponding to the largest eigenvalue and is the optimum cluster vector indicator for binary hypothesis testing, such as determining whether an insulation defect exists. The first PC $v_1$ is plotted, or otherwise examined, to determine threshold τ. As may be appreciated, the steps involved in PCA, including creation of the covariance matrix and calculation of the eigenvector and eigenvalues are known in the art.

At step 238, the first processing device calculates the location of the insulation defect. The calculation of the insulation defect location results in an estimate distance from one of the two sensors. One formula that may be used to estimate this distance is: $d=(L-v*(t_1-t_2))/2$. Specifically, d is the distance away from a first sensor toward a second sensor where the insulation defect is located; L is the distance between the sensors; v is the propagation velocity along the cable; $t_1$ is the time of the maximum cumulative energy calculated using the signal from the first sensor; and $t_2$ is the time of the maximum cumulative energy calculated using the signal from the second sensor. After the location of the insulation defect has been determined, the processing device may send the location information to another device where the information may be viewed and analyzed to take corrective action.

Steps 236 and 238 as discussed may be performed using software, hardware, or a combination thereof. Furthermore, steps 236 and 238 may be part of decision module 160 as described in FIG. 5.

The systems, devices, and methods described above may be used to continuously or periodically monitor underground cable systems, or other cable systems, for defects such as insulation defects. Certain embodiments may include fewer or greater number of steps or devices to detect and determine the location of such defects. As may be appreciated, detecting defects quickly and with accurate locations may enable cable systems to be maintained and operate efficiently. Furthermore, the defects may be detected passively without injecting signals into the cable systems, thereby decreasing cable system downtime and costs associated with such downtime.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for determining an insulation defect in a cable comprising:
   receiving, at a data acquisition system, a first signal from a first sensor;
   calculating a first set of signal features using the first signal;
   receiving a second set of signal features calculated using a second signal from a second sensor;
   calculating a set of derived features by dividing each feature from the first set of signal features by a corresponding feature from the second set of signal features;
   performing principal component analysis on the set of derived features to produce a first principal component; and
   comparing the first principal component to a predetermined threshold to determine whether an insulation defect exists.

2. The method of claim 1, wherein calculating a first set of signal features using the first signal comprises calculating a first cumulative wavelet energy using the first signal and selecting a first sample index indicating a first maximum cumulative energy from the first cumulative wavelet energy calculation.

3. The method of claim 2, wherein the second set of signal features comprises a second sample index indicating a second maximum cumulative energy calculated using the second signal.

4. The method of claim 3, comprising calculating an insulation defect location using the first and second sample indices.

5. The method of claim 1, wherein the predetermined threshold is determined using principal component analysis based clustering on a combination of data indicating the presence of insulation defects and data indicating the absence of insulation defects.

6. The method of claim 1, wherein the first and second sets of signal features comprise at least one statistical feature, FFT based feature, or non-stationary signal feature.

7. The method of claim 1, wherein calculating a first set of signal features using the first signal comprises determining non-stationary signal features by:
   performing empirical mode decomposition on the first signal to determine a plurality of intrinsic mode functions;
   selecting the first four intrinsic mode functions from the intrinsic mode functions; and
   computing an energy value for each of the first four intrinsic mode functions by summing the square of each of the first four intrinsic mode functions.

8. The method of claim 1, wherein calculating a first set of signal features using the first signal comprises determining a cumulative wavelet energy by calculating a set of wavelength coefficients using the first signal and summing the square of the wavelet coefficients.

9. One or more non-transitory machine-readable storage media having application instructions encoded thereon, the application instructions comprising:
   instructions for receiving a first signal from a first sensor;
   instructions for calculating a first set of signal features using the first signal;
   instructions for receiving a second set of signal features calculated using a second signal from a second sensor;
   instructions for calculating a set of derived features by dividing each feature from the first set of signal features by a corresponding feature from the second set of signal features;
   instructions for performing principal component analysis on the set of derived features to produce a first principal component; and
   instructions for comparing the first principal component to a predetermined threshold to determine whether an insulation defect exists.

10. The storage media of claim 9, wherein the instructions for calculating a first set of signal features using the first signal comprise instructions for calculating a first cumulative wavelet energy using the first signal and instructions for selecting a first sample index indicating a first maximum cumulative energy from the first cumulative wavelet energy calculation.

11. The storage media of claim 10, wherein the second set of signal features comprises a second sample index indicating a second maximum cumulative energy calculated using the second signal.

12. The storage media of claim 11, comprising instructions for calculating an insulation defect location using the first and second sample indices.

13. The storage media of claim 9, wherein the first and second sets of signal features comprise at least one statistical feature, FFT based feature, or non-stationary signal feature.

14. The storage media of claim 9, wherein the instructions for calculating a first set of signal features using the first signal comprise instructions for determining a cumulative wavelet energy by calculating a set of wavelength coefficients using the first signal and summing the square of the wavelength coefficients.

15. A device for detecting an insulation defect in a cable comprising:
   a housing;
   a memory device disposed in the housing and including executable application instructions stored therein; and
   a processor disposed in the housing and configured to execute the application instructions stored in the memory device;
   wherein the application instructions comprise instructions for receiving a first signal from a first sensor, calculating a first set of signal features using the first signal, receiving a second set of signal features calculated using a second signal from a second sensor, calculating a set of derived features by dividing each feature from the first set of signal features by a corresponding feature from the second set of signal features, performing principal component analysis on the set of derived features to produce a first principal component, and comparing the first principal component to a predetermined threshold to determine whether an insulation defect exists.

16. The device of claim 15, wherein calculating a first set of signal features using the first signal comprises calculating a first cumulative wavelet energy using the first signal and selecting a first sample index indicating a first maximum cumulative energy from the first cumulative wavelet energy calculation.

17. The device of claim 16, wherein the second set of signal features comprises a second sample index indicating a second maximum cumulative energy calculated using the second signal.

18. The device of claim 17, wherein the application instructions for calculating an insulation defect location using the first and second sample indices.

19. The device of claim 15, wherein calculating a first set of signal features using the first signal comprises determining non-stationary signal features by:
    performing empirical mode decomposition on the first signal to determine a plurality of intrinsic mode functions;
    selecting the first four intrinsic mode functions from the intrinsic mode functions; and
    computing an energy value for each of the first four intrinsic mode functions by summing the square of each of the first four intrinsic mode functions.

20. The device of claim 15, wherein calculating a first set of signal features using the first signal comprises determining a cumulative wavelet energy by calculating a set of wavelength coefficients using the first signal and summing the square of the wavelength coefficients.

* * * * *